June 27, 1967 G. D. KNEIP, JR., ETAL 3,328,271
METHOD OF ELECTROPLATING COPPER ON NIOBIUM-ZIRCONIUM
ALLOY SUPERCONDUCTORS FOR STABILIZATION
Filed Sept. 22, 1964
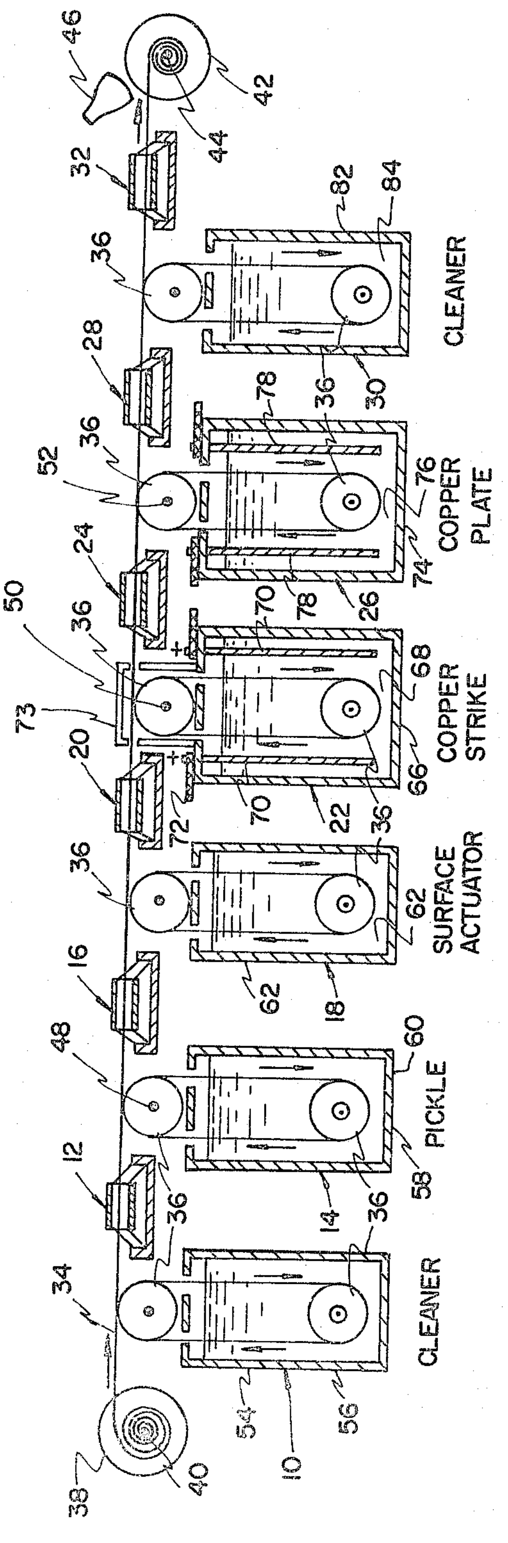

United States Patent Office 3,328,271
Patented June 27, 1967

3,328,271

METHOD OF ELECTROPLATING COPPER ON NIOBIUM-ZIRCONIUM ALLOY SUPERCONDUCTORS FOR STABILIZATION

George D. Kneip, Jr., Concord, Mass., and Ruth Oliver Turnbaugh, Oakland, Calif., assignors to National Research Corporation, Cambridge, Mass., a corporation of Massachusetts Filed Sept. 22, 1964, Ser. No. 398,275
1 Claim. (Cl. 204—32)

This invention relates to coating and more particularly to the coating of wires with copper.

A principal object of the present invention is to provide a method for producing an adherent, smooth high purity copper coating on wire, particularly superconducting wire.

Another object of the invention is to provide a method for producing a copper coating of the above type on superconducting wire comprising niobium and zirconium.

Other objects of the invention will in part be obvious and will in part appear hereinafter.

For a fuller understanding of the nature and objects of the invention, reference should be had to the following detailed description taken in connection with the accompanying drawing which is a diagrammatic, schematic sectional view illustrating a system for coating wire according to the present invention.

In recent years considerable effort has been directed to the development of superconducting materials for use in devices such as superconducting magnets. Many of the contemplated superconducting devices involve the use of a superconducting material in the form of a fine, ductile wire having a diameter, for example, on the order of about 15 mils or less. The superconducting wire may take the form of single or multiple straight strands, or for many magnetic applications may assume the form of one or more coils, as in a solenoid. For example, a superconducting solenoid can be formed by appropriately winding a suitable core with, say, 10 mil superconducting wire comprising an alloy of niobium and zirconium to form a coil of the desired configuration. The coil is then made superconducting by subjecting it to a low temperature environment such as liquid helium to reduce the temperature of the coil below the transition or critical temperature of the wire material utilized.

It has heretofore been proposed to provide a thin coating of a metal such as copper on superconducting wire. The copper coating is generally thought to stabilize local instabilities in the superconductor by providing an electrical shunt as well as a thermal heat sink along the wire. It also provides a shunt or secondary circuit for coil protection and can be used as a means of removing the magnetic field energy from the Dewar/coil region. Such a copper coating thus should possess several necessary properties. It should possess excellent thermal and electrical conductivities to provide the superconducting wire with a very effective heat sink and current shunt path. These properties are particularly important in preventing or at least minimizing damage to the superconducting wire should it lose its superconductivity and revert to its normal resistive state during operation. When a superconducting wire during operation becomes overloaded due to the exceeding of a critical limitation thereof, e.g. critical temperature or field and returns to its normal state, the large current flowing through the wire can result in the destruction or serious damaging of the wire or wire coil. In the normal state, the current flowing through the wire is dissipated by conversion to heat. This heat on occasion may be sufficient to melt the wire or destroy a coil configuration or destroy any organic insulating coating on the wire and possibly cause short circuiting. In the event a superconducting wire having the desired copper coating reverts to its normal resistive state during operation, the wire is protected from destruction or serious damage since the current will be automatically shunted through the path of least resistance, that is, through the copper coating which also functions as a heat sink for the rapid dissipation of heat. The desired excellent thermal and electrical conductivities can be obtained with high purity copper coatings.

Additionally, there must be a good bond between the copper and superconducting wire to facilitate the transfer of energy as well as to withstand the rigors of coil winding. The bonding of the copper coating to the superconducting wire must be sufficiently strong or tenacious so that the wire can be wound, for example, around cores or mandrels having very small diameters without the copper coating cracking or separating from the base wire. Moreover, since the copper and base wire possess different coefficients of expansion, the bond therebetween must be sufficiently strong so that the copper does not crack or separate from the base wire when subjected to the very low superconducting operating temperature. Furthermore, the copper coating provides an excellent means for making electrical connections to the superconducting wire. The bond should offer minimum resistance to the transfer of energy, that is, the copper and the base wire bond should be as free as possible from materials, e.g. oxides which provide appreciable resistance to the transfer of electrical and thermal energy.

The copper coating must also be smooth and substantially free from "treeing" effects which are often obtained with electroplated copper. The "treeing" effects generally consist of whiskers and nodules, frequently of a size sufficient to puncture the organic plastic insulating material often provided around the copper coated wire. Such coating defects offer the danger of causing short circuits.

In the present invention there is provided a method for producing a smooth, continuous, strongly adherent, high purity electroformed copper coating on superconducting wire; the bond therebetween having a very low electrical resistance. Briefly, the method of the present invention comprises first removing contaminants such as grease, oxides and the like from the surface of the wire and then passing the cleaned wire through a surface activation bath comprising an aqueous solution of hydrofluoric acid, a nickel salt and an iron salt. In one embodiment the salts are chlorides. The pretreated wire is then passed through a copper strike bath to provide a thin adherent copper coating on the wire and thereafter passed through a copper plating bath to build up the copper coating thereon to the desired thickness. In one embodiment of the invention the superconducting wire to be copper coated comprises, by weight, from about 20 to about 50 percent zirconium, the sum total of oxygen, nitrogen, carbon and hydrogen, ranging between about 0.03 to about 0.05%, at least 50% of said sum total being oxygen, and the balance of the alloy being niobium.

Referring now to the drawing there is shown one means for copper plating superconducting wire according to the present invention. This means comprises a plurality of units 10, 12, 14, 16, 18, 20, 22, 24, 26, 28, 30 and 32 through which the superconducting wire to be copper coated, indicated by the numeral 34, is consecutively passed, the circuitous course of the wire through the units being determined by rolls 36. These rolls are preferably grooved rolls in order to provide for the proper guidance of the wire in its path of travel.

The wire 34 to be coated, for example, a niobium-zirconium alloy as heretofore noted is fed from a feed roll or reel 38 suitably supported by shaft 40. The wire after coating is taken up on roll or reel 42 suitably supported or mounted on shaft 44. The coated wire is dried by heating means 46 shown here as being a heat lamp.

The wire is advanced through the coating means by driving at least shaft 44 and the wind-up reel 42 thereon by means of a suitable motor (not shown). One or more of the shafts carrying rolls 36 can also be suitably driven to aid in moving the fine wire through the unit at a desired rate of speed without having the wire break. For example, shafts 48, 50 and 52 of the upper rolls 36 of units 14, 22 and 26 can also be suitably driven. In this case, one or more of the rolls 36 carried by each of the shafts is secured thereto so as to be driven, the remaining rolls, if any, being allowed to rotate freely about the shaft.

Unit 10 designated as a cleaner comprises a tank or container 54 of suitable material containing a soap or detergent bath 56 for removing grease, dirt and the like. Preferably, this bath is heated to an elevated temperature such as to between about 150° F. and 200° F. Any of the well-known soaps or detergents for degreasing metal can be utilized. In one embodiment, the degreasing bath 56 preferably comprises a hot aqueous solution of an alkaline detergent. Following the wire degreasing unit 10 is a water rinse unit 12 for rinsing the degreased wire with running water.

Unit 14 designated as a pickle comprises a tank 58 of suitable material containing an acid pickling solution 60 for removing oxide films, sulfide films and the like from the wire 34. In one embodiment, the pickle comprises an aqueous solution of hydrofluoric, nitric and sulfuric acids. This solution is preferably operated at about room temperature. A running water rinse unit 16 follows the acid pickle.

Unit 18 designated as a surface activator comprises a tank 62 of suitable materials containing a bath 64 for activating the wire surface with iron and nickel. In one embodiment of the invention the surface activation bath comprises an aqueous solution of hydrofluoric acid, a nickel salt and an iron salt. Preferably, the nickel salt comprises nickel chloride ($NiCl_2$) and the iron salt comprises iron chloride ($FeCl_3$). Bath 64 preferably is operated at about room temperature. The duration of the wire in this bath should be relatively short in order to avoid excessive loss of wire. For example, no unit area of the wire should be subjected to said bath for a period of time in excess of about 30 seconds.

Surface activation bath 64 serves very important functions in the present invention in that it so treats or reacts upon the wire surface that oxide is eliminated therefrom and further oxide formation thereupon prevented. Moreover, such treatment also results in a wire surface which provides for the good mechanical bonding of copper thereto. Utilizing the above pretreatment of superconducting wire just prior to the copper plating thereof, firmly adherent copper coatings can be obtained thereon, the bond between the wire and copper being substantially oxide-free and having a low electrical resistance which is extremely desirable.

The surface pretreated unit 18 is followed by a running water rinse unit 20. Unit 22 designated as a copper strike comprises a tank 66 of suitable material containing a copper strike bath 68 for depositing a very thin, smooth, adherent copper coating on the wire 34. Preferably, the thickness of the copper coating deposited on the wire in the strike is not allowed to exceed about 0.2 mill on radius. In one preferred embodiment, the conditions are regulated so that during the passage of the wire through the strike bath, a deposit of copper having a thickness on the order of about 0.1 mill is provided on the wire. A plurality of anodes 70 are immersed in the bath. The anodes 70 are attached at their upper ends to a suitable power source (not shown) by means of connectors 72. Since it is preferably desirable to maintain a low concentration of free copper in the strike bath, some of the anodes are of a conductive material other than copper, for example, stainless steel. The copper anodes used are preferably of very high purity in order to provide for the formation of a very high purity copper deposit on the wire.

In one embodiment, the strike bath is a copper cyanide strike comprising, for example, an aqueous solution of copper cyanide, potassium cyanide and potassium hydroxide. Additives such as Rochelle salts or the like can also be included therein. Preferably, this bath is heated and vigorously agitated during operation and accordingly suitable means (not shown) are provided to accomplish the same. The above strike bath 68 can be operated, for example, at temperatures between about 120° F. and about 170° F. In order to maintain the composition of the strike bath substantially constant during operation and to maintain the wire wetted therewith at all during the strike operation, a cover or enclosure 73 such as is shown, is preferably provided about upper rolls 36 of tank 66.

The rolls 36 of the unit 22 are formed of a conductive material such as, for example, stainless steel. The wire is made the cathode of the system by suitable electrical contact to shaft 50 by means not shown.

Following the copper strike unit 22 is another running water rinse unit 24. This unit is in turn followed by unit 26 designated as a copper plate. Unit 26 comprises a tank 74 of suitable material containing a copper plating bath 76 for building up the deposit of copper on the wire to the desired thickness for example, between about 0.75 and 1.5 mils on say 10 mil wire. A plurality of very high purity copper anodes 78 are immersed in the bath and are attached at their upper ends to a suitable power source (not shown) by means of connectors 80.

Any of the well-known copper plating baths and particularly the acid copper plating baths can be utilized. Preferably, the plating bath comprises an aqueous solution of copper fluoborate ($Cu(BF_4)_2$) and fluoboric acid ($HBF_4$). The use of fluoborate plating solutions is very desirable since they permit operation over a wide range of temperatures, concentrations, current densities, and solution pH. They also permit high rates of copper deposition. The plating bath is preferably heated and vigorously agitated and accordingly, is provided with suitable means (not shown) for accomplishing the same. Temperatures between about 115° F. and about 150° F. can be satisfactorily utilized for fluoborate plating baths.

The rolls 36 of unit 26 are also formed of a conductive material such as stainless steel. The wire is made the cathode of the system by the use of, for example, contact rollers (not shown) which engage shaft 52 for making electrical contact thereto.

The copper plate unit 26 is followed by a running water rinse unit 28. Unit 30 which follows unit 28 is designated as a cleaner and comprises a tank 82 of suitable material containing a bath 84 for cleaning the copper coated wire. Bath 84 can comprise, for example, an aqueous solution of a cyanide salt such as potassium cyanide. This copper wire cleaning bath is preferably maintained at about room temperature during operation.

Following unit 30 is a final running water rinse unit 32. After being finally rinsed with water the copper coated superconducting wire is uniformly wound up on reel 42 while being dried by heating means such as one or more heat lamps 46.

The following non-limiting example illustrates one method for plating superconducting wire with copper in accordance with the present invention.

In this case the superconducting wire 34 was an alloy of niobium and zirconium comprising, by weight, about 25% zirconium, the sum total of oxygen, nitrogen, carbon and hydrogen ranging between about 0.03 and 0.05%, at least 50% of said sum total being oxygen and the balance of the alloy being niobium. In addition, to this wire, wires of other similar alloys containing between 20 and 50% zirconium can also be utilized, e.g. 33% zirconium.

The wire 34 having a diameter on the order of about 10.1 mils was unwound from reel 38 and drawn in the direction of the arrows around the rolls 36 and through the various baths at a rate of speed of about 10 feet per minute. The tension or pull on the fine wire was such that it was sufficient to maintain the wire taut around the rolls without causing the breakage thereof. The units 10, 14, 22 and 26 were provided with a plurality of upper and lower rolls 36 around which the wire was suitably looped so that the wire would be subjected to the baths contained in these units for the desired periods of time.

Wire 34 from reel 38 was passed through tank 54 which contained an aqueous solution on an alkaline detergent 56 maintained at temperature on the order of about 180° F. in order to remove grease and the like therefrom. The degreased wire was rinsed with water, preferably running water to remove any detergent, loose grease and dirt and then passed through tank 58 containing a pickling solution 60 to remove surface oxide films and the like. The pickle in this instance comprised per gallon about 56.25 cc. of 70% hydrofluoric acid, 375 cc. of 66° Bé. sulfuric acid, 84.5 cc. of 42° Bé. nitric acid, 48.75 grams of ferric sulfate and water to make one gallon.

The pickled wire was rinsed with running water to remove any pickling solution and then passed through the pretreat tank 62 containing a surface activation bath 64 maintained at about room temperature. In this instance each unit area of wire was subjected for a period of about 20 seconds to an activation bath comprising per gallon about 263 cc. of 70% hydrofluroic acid, 15 grams of ferric chloride ($FeCl_3.6H_2O$), 11.25 grams of nickel chloride ($NiCl_2.6H_2O$) and water to make one gallon. The function of this bath was to remove from the surface of the wire any oxide such as that which might have been formed on the wire during its passage from the pickle bath and to provide a surface which was resistant to oxidation, during the passage of the wire to the copper strike. Moreover, this bath also functioned to activate the surface in order to provide for better copper bonding thereto.

The wire after passage through the activation bath had a diameter of about 10.0 mils. The treated wire was rinsed with running water to remove any surface activation solution and then passed into tank 66 containing a vigorously agitated copper cyanide strike 68 maintained at a temperature of about 150° F. The copper cyanide strike in this case comprised per gallon about 2.3 ounces of copper cyanide, 3.0 ounces of potassium cyanide, sufficient potassium hydroxide to adjust the pH of the solution to 12.5 and water to make one gallon. The current density utilized was about 10 amps per square foot. The copper content in the bath was maintained low, on the order of between about 0.3 to about 0.45 ounces per gallon in order to slowly deposit a very thin, high purity, smooth, adherent coating on the wire.

The wire after passage through the strike had a copper coating of about 0.1 mil on radius. The thinly copper coated wire was rinsed with running water to remove any strike solution and then passed into tank 74 containing a vigorously agitated copper fluoborate plating bath 76 maintained at a temperature of about 120° F.

The fluoborate bath in this case comprised per gallon about 0.65 gallon of 45% copper fluoborate concentrate, 0.04 gallon of 48% fluoboric acid and 0.31 gallon of water. The current density employed was about 150 amps per square foot.

The wire after passage through the fluoborate plating bath had a copper coating of about 1 mil on radius. The copper coated wire was flushed with running water and then passed into tank 82 containing a bath 84 comprising an aqueous solution of potassium cyanide maintained at about room temperature. The solution in this instance comprised about 6 ounces of potassium cyanide per gallon of water.

The copper coated wire was then finally rinsed with running water and taken-up on wind-up or receiving reel 42. As the wire was uniformly level wound on reel 42 it was dried.

Inspection of the above electrodeposited copper coating indicated that it was continuous and smooth. The above wire could be wound around a ⅛ inch mandrel and also subjected to temperatures as low as 4.2° K. or below without cracking or separating from the base wire, thus, indicating the excellence of the bond. The bond electrical resistance at 4.2° K. was on the order of about one microhm which low value indicates the existence of good bond with little or no oxide. At 4.2° K., with no ambient, artificially induced magnetic field the copper coating was found to be able to carry in excess of 90 amps without quenching the superconductor.

Whenever the expressions "percent" or "%" are used in the specification and claim, they are to be deemed to refer to weight percent.

Since certain changes may be made in the above described details without departing from the scope of the invention herein involved, it is intended that all matters contained in the description shall be interpreted as illustrative and not in a limiting sense.

What is claimed is:

A method for producing an adherent, smooth, high purity copper plating on superconducting wire comprising, by weight, from about 20 to about 50% zirconium and the balance niobium to stabilize the superconductor, which method comprises the steps of removing contaminants from the surface of said wire, passing said cleaned wire through a surface activation bath comprising an aqueous solution of about 260 cc. of 70% hydrofluoric acid, about 15 grams of ferric chloride ($FeCl_3.6H_2O$), about 11 grams of nickel chloride ($NiCl_2.6H_2O$) and water to make one gallon, the bath being maintained at room temperature, the passage of wire through the activation bath being limited to a time period of less than 30 seconds, passing the wire from the activation bath to a copper cyanide strike bath maintained at a temperature between about 120° F. and about 170° F. to provide a thin adherent copper coating on said wire, and then passing said copper coated wire through a copper plating bath containing copper fluoborate, maintained at a temperature between about 115° F. and 150° F., to build up the copper coating thereon to the desired thickness.

References Cited

UNITED STATES PATENTS

| | | | |
|---|---|---|---|
| 2,580,773 | 1/1952 | Heiman | 117—130 |
| 2,938,841 | 5/1960 | Dale | 204—32 |
| 3,057,048 | 10/1962 | Hirakis | 29—194 |

OTHER REFERENCES

Faust et al.: Article, "Plating on Unusual Metals," Plating, September 1956, pp. 1134–1142.

JOHN H. MACK, *Primary Examiner.*

HOWARD S. WILLIAMS, *Examiner.*

W. VAN SISE, *Assistant Examiner.*